Figure 1:
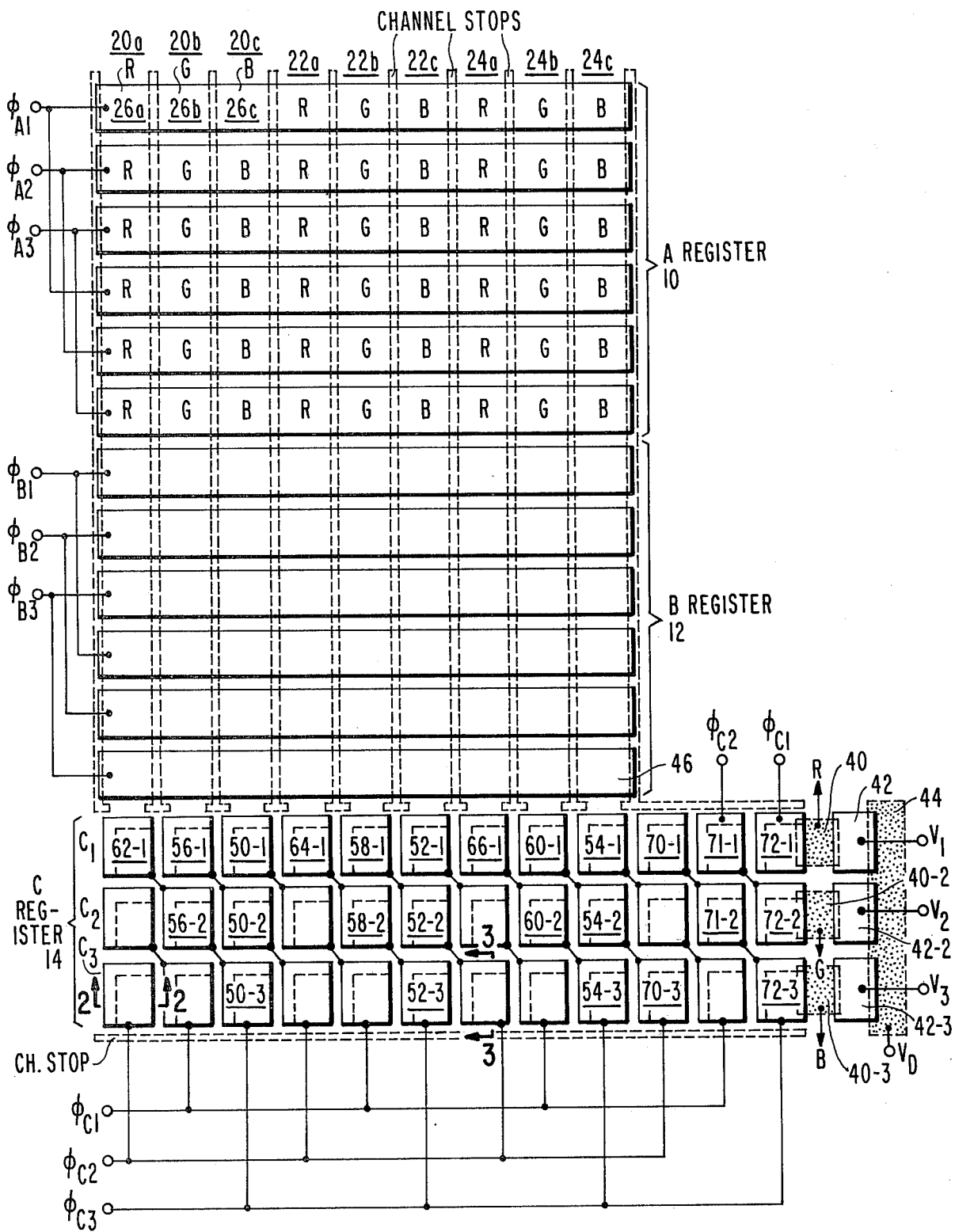

United States Patent [19]

Weimer

[11] 4,001,878
[45] Jan. 4, 1977

[54] CHARGE TRANSFER COLOR IMAGERS
[75] Inventor: Paul Kessler Weimer, Princeton, N.J.
[73] Assignee: RCA Corporation, New York, N.Y.
[22] Filed: Nov. 19, 1975
[21] Appl. No.: 633,478
[52] U.S. Cl. .................................. 358/41; 357/24; 357/31
[51] Int. Cl.$^2$ ........................................ H04N 9/07
[58] Field of Search .......... 358/41, 43, 44; 357/24, 357/30–32

[56] References Cited
UNITED STATES PATENTS
3,777,061  12/1973  Takemura .................. 358/44

OTHER PUBLICATIONS
B502,289, Jan. 1976, Chai, 358/41.

Primary Examiner—Howard W. Britton
Assistant Examiner—Mitchell Saffian
Attorney, Agent, or Firm—H. Christoffersen; Samuel Cohen

[57] ABSTRACT

The columns of a charge transfer imager are arranged in groups with N columns in each group, each column of a group receiving light through a different color filter. Upon the completion of the integration time, each line is shifted out of the imager 1/N'th of a line at a time, each N'th of a line representing a different color component of the image. The different parts of each line subsequently are read serially and concurrently to obtain the N color signal components of each resolution element of the imager.

9 Claims, 4 Drawing Figures

CHARGE TRANSFER COLOR IMAGERS

The present application deals with charge transfer imagers and particularly with color charge transfer imagers.

Figures 2, 3:
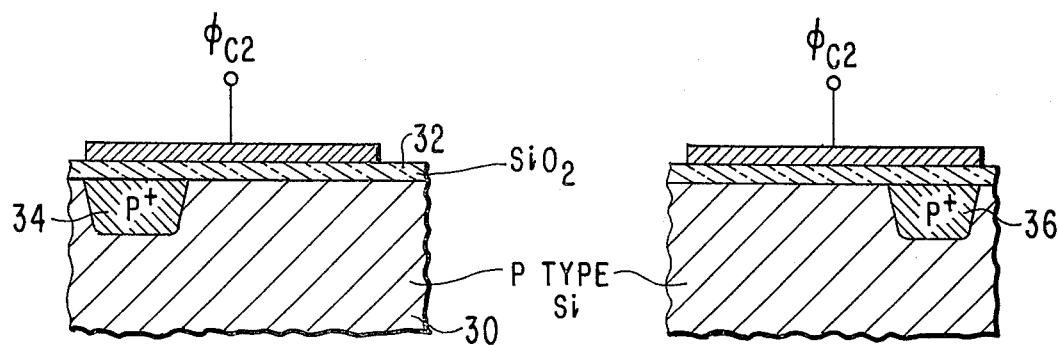
Figure 4:
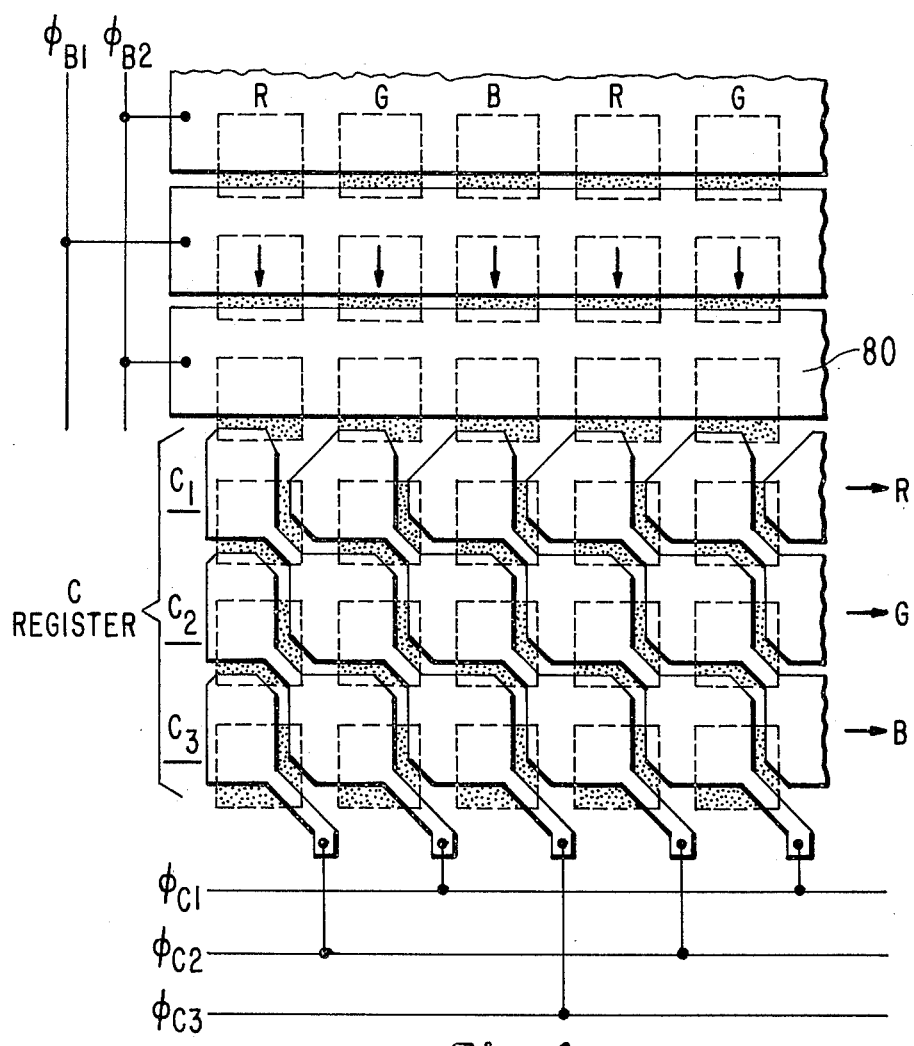

The invention is illustrated in the drawing, of which:

FIG. 1 is a schematic showing of a charge-coupled device (CCD) color imager according to one embodiment of the invention;

FIGS. 2 and 3 are sections taken along lines 2—2 and 3—3 respectively of FIG. 1 showing details of the electrode structure of the C register of FIG. 1; and FIG. 4 is a schematic showing of a portion of a bucket-brigade type color imager according to another embodiment of the invention.

The color imager of FIG. 1 includes a photosensing array 10, hereafter termed an A register, a temporary storage array 12, hereafter termed a B register, and an output register 14, hereafter termed a C register. The scene being viewed is projected onto the A register 10 either through the electrodes (front surface illumination) or through the semiconductor substrate (back surface illumination). The B and C registers are masked, that is, means are provided for preventing a radiant energy image from reaching either register.

The A and B registers have channel stops extending in the column direction to isolate the channels (the columns of the CCD) from one another. The electrodes, shown schematically, may be any one of the usual single layer polysilicon construction or overlapped polysilicon or polysilicon overlapped by metal construction, or any other of the known three phase type of electrode structures. For purposes of illustration, the single layer polysilicon electrode structure is illustrated. It may comprise, for example, highly doped regions which form the conductors, separated by intrinsic regions which form the insulation between adjacent electrodes. The imager, while illustrated to be three phase operated, may of course be two phase operated (provided appropriate electrodes are employed to insure unidirectional signal propagated) or four or higher phase operated.

According to one feature of the present invention, the A register 10 includes filters of different colors over the different columns, respectively, in each group of three columns. Thus, all of the $a$ columns are formed with a red filter through which an image is projected onto the array; all of the $b$ columns are formed with a corresponding green filter, and all of the $c$ columns are formed with a corresponding blue filter. For purposes of illustration, only nine columns are illustrated and they are divided into three groups 20, 22 and 24, each group, such as 20, containing three columns such as 20a, 20b, and 20c. The width of a single resolution element is equal to the portions of a row conductor over three adjacent columns such as portions 26a, 26b, and 26c. (An entire resolution element may be considered to comprise the area covered by three columns and three rows as explained later). Each portion, such as 26a, of a conductor operates as a single electrode and is hereafter termed an electrode.

The filter itself is illustrated only schematically by the capital letters R, G, and B. Each filter may be a multilayer interference filter or simply a dyed absorption type filter, formed of plastic for example, both types of filters in themselves being well known. The filter strips are located over the image receiving surface of the A register. For example, in the case of a rear surface illuminated imager, they would be located on the rear surface of the substrate.

The C register comprises three sections, $C_1$, $C_2$, and $C_3$. The $C_1$ section is immediately adjacent to the B register. Each electrode of the $C_1$ section is aligned with a different channel of the B register. A detail, in cross-section, of an electrode in the C register appears in FIGS. 2 and 3. The electrode is insulated from the substrate 30 by a thin silicon dioxide ($SiO_2$) insulating layer 32. There is formed in the substrate beneath the left edge of each electrode an ion implanted region 34 of the same conductivity type as the substrate but of higher impurity concentration than the substrate. A similar ion implanted region 36 is located beneath the upper edge of each electrode as illustrated in FIG. 3. The purpose of these regions is to cause a shallower depletion region to form than beneath the remaining portion of the electrode in response to a positive voltage applied to the electrode and in this way to insure unidirectional signal propagation, as will be discussed shortly.

The output portion of the C register is conventional. Each section includes a floating diffusion such as 40 of opposite conductivity than the substrate and a reset electrode such as 42. There is also a drain diffusion 44 of opposite conductivity type than the substrate and which may be common to the three C register sections. Each control electrode such as 42 may overlap the floating diffusion and the drain diffusion. The drain diffusion may be held at a fixed potential $V_D$ which would be positive in the case of a surface channel CCD with P type substrate where the charge carriers are electrons.

In the operation of the system of FIG. 1, during the so called integration time, a scene or other image is projected onto the A register. The light causes charges to be produced at various location of the A register in accordance with the light intensity, and its color, reaching the respective locations. The color filters insure that the different color components will be stored in different columns of each three column group.

Upon the completion of the integration time (during the vertical blanking interval of commercial television), the charge signals which have accumulated (a "field") are transferred, in parallel, in the column direction from the A to the B register by the application of the multiple phase voltages $\phi_{A1}$, $\phi_{A2}$, $\phi_{A3}$ and $\phi_{B1}$, $\phi_{B2}$ and $\phi_{B3}$. During this time, the $\phi_A$ and $\phi_B$ voltages are at the same frequency and in synchronism. Thereafter, the $\phi_A$ voltages are applied in a sense to permit integration of a new field. For example, only $\phi_{A1}$ or alternatively, both $\phi_{A1}$ and $\phi_{A2}$, may be held at positive values to cause depletion regions to form in the substrate and $\phi_{A2}$ and $\phi_{A3}$ in the first case or $\phi_{A3}$ in the second case may be held at a relatively less positive value or at a negative value to cause potential barriers to form in the substrate between depletion regions. Thus, the smallest image increment which can be resolved is that projected onto the area occupied by nine electrodes (three columns and three rows), that is, nine electrodes comprise one resolution element.

Concurrently with the integration being performed in the A register, the $\phi_B$ multiple phase voltages are applied to the B register for transferring the charge signals temporarily stored in the B register to the C register. The transfer takes place one third of a line at a time (during the horizontal retrace line of commercial television) in the following way. Assume that a line of information is present beneath electrodes 46 of the last row. This means that $\phi_{B3}$ is relatively positive. Assume that at the same time $\phi_{C1}$ is relatively positive. The transfer of a line from the B to the C register takes place at very high speed, all three phases of the $\phi_C$ multiple phase voltages occurring while $\phi_{B3}$ is high. When $\phi_{C1}$ is high, it places electrodes 50-1, 52-1 and 54-1 at this same level and charge signals present in columns 20c, 22c and 24c transfer to beneath electrodes 50-1, 52-1 and 54-1 respectively. Thus, one third of a word — the third containing information as to the blue (B) color component of the image, has been transferred from row 46 to register section $C_1$. $\phi_{C1}$ may be sufficiently more positive than $\phi_{B3}$ to insure complete or substantially complete charge transfer.

Next $\phi_{C2}$ goes high while $\phi_{C1}$ goes low. This causes the charge signals present beneath electrodes 50-1, 52-1 and 54-1 to transfer beneath electrodes 50-2, 52-2 and 54-2. The ion implanted regions beneath the upper edges of the electrodes 50-1, 52-1 and 54-1 insure unidirectional propagation (in the down direction in FIG. 1) of the charge signals. That is, as the voltage on an electrode such as 50-1 is becoming less positive and the voltage on an electrode such as 50-2 is becoming more positive, the charge preferentially flows to beneath electrode 50-2 rather than back to beneath electrode 46 even though the latter is still at a relatively high (positive) level. The ion implanted region beneath the left edge of an electrode such as 50-1 and its absence at the lower edge of electrode 50-1 causes the charge beneath electrode 50-1 to flow preferentially downward to electrode 50-2 rather than to electrode 56-1.

At the same time that one third of a word is being transferred from the $C_1$ to the $C_2$ register section, another third of a word is being transferred from electrode 46 to the $C_1$ register section. Thus, charge present in channel 20b transfers to beneath electrode 56-1; charge present in channel 22b transfers to beneath electrode 58-1; and charge present in channel 24b transfers to beneath electrode 60-1. This third of the word contains information as to the green (G) color component of the image.

Next $\phi_{C3}$ goes high while $\phi_{C2}$ goes low. It can be shown that in a manner similar to that discussed above, the first third of a word now transfers to beneath electrodes 50-3, 52-3 and 54-3 in the $C_3$ register section. At the same time, the second third of a word transfers to register section $C_2$ beneath electrodes 56-2, 58-2 and 60-2. Finally, the last third of the word, this one containing information as to the red (R) color component, transfers from channels 20a, 22a and 24a to beneath electrodes 62-1, 64-1 and 66-1 respectively. Thus, the C register now stores all of the color information formerly in row 46. Section $C_1$ stores the red color information; section $C_2$ stores the green color information and section $C_3$ stores the blue color information.

The readout of the C register now begins. The readout must take place, that is, the C register must be emptied, during the time interval before the next row of information is shifted into the last row 46, and the frequency of the $\phi_C$ voltages is adjusted accordingly. In terms of commercial television, this readout takes place during the horizontal line time. Further, in the embodiment illustrated, during readout the order of the multiple phase voltages is changed, that is, they occur in the order $\phi_{C3}$, $\phi_{C2}$, $\phi_{C1}$.

The readout of the C register is accomplished in the following way. Assume that the last third of the row of charge signals is present in register $C_1$ and $\phi_{C3}$ is high. A blue color signal is present beneath electrode 54-3, the one in section $C_3$ aligned with channel 24c. Now $\phi_{C2}$ goes high while $\phi_{C3}$ goes low. This causes charge to transfer one place to the right in all C register section. Thus, the blue (B) component beneath electrode 54-3 transfers to beneath electrode 70-3; the green (G) component beneath electrode 60-2 transfers to beneath electrode 54-2; and the red (R) component beneath electrode 66-1 transfers to beneath electrode 60-1. The implanted regions beneath the upper edges of the various electrodes driven by $\phi_{C3}$, which is becoming less positive while $\phi_2$ is becoming more positive, prevents any upward transfer of charge. This process continues, until when $\phi_{C3}$ goes high again, all charge signals in the C register have transferred three electrodes to the right, with the first blue color signal (that formerly present in column 24c) present beneath electrode 72-3. This signal passes to the floating diffusion 40-3 to which the output lead legended B is connected. Therefore, the blue color signal which came from channel 24c is available as an output signal. This output signal may be applied to an output amplifier (not shown) and then to a utilization circuit (not shown). After this output signal passes to the amplifier, control signal $V_3$ is made positive to reset the floating diffusion 40-3 to the approximate potential of the drain region 44, in conventional fashion.

After $\phi_{C3}$ has gone high, $\phi_{C2}$ goes high and $\phi_{C3}$ goes low. This shifts the contents of all C register sections one increment to the right. In particular, the green color signal derived from channel 24b which was stored beneath electrode 71-2 of the $C_2$ register section shifts to beneath electrode 72-2 and from there to the output diffusion 40-2. As in the previous case, the output signal thereby obtained may be amplified and sent to a utilization circuit and thereafter the control voltage $V_2$ goes high to reset the floating diffusion 40-2 to the drain 44 potential.

Next $\phi_{C1}$ goes high and $\phi_{C2}$ goes low. Again this shifts the contents of the C register one additional place to the right. Just prior to $\phi_{C1}$ going high, electrode 71-1 was storing the red color signal from channel 24a. When $\phi_{C1}$ goes high and $\phi_{C2}$ low, this charge signal moves to beneath electrode 72-1 and then to floating diffusion 40. Again this output signal may be amplified and applied to the utilization circuit and then $V_1$ is turned on to reset the floating diffusion 40 to the drain potential. In each of the cases above, after the floating diffusion is reset, the control voltage ($V_1$ or $V_2$ or $V_3$) is returned to its quiescent, relatively less positive level.

The operation just discussed has shown how the red, green and blue signals in one resolution element — the right-most such element 24, has been read out of the last row of the register. By continuing the $\phi_C$ multiple phase voltages, the succeeding resolution elements in the row are red out. The color components of each resolution elements, in this embodiment, are read out sequentially, first the blue, then the green and then the red color component. However, if desired, all three components of each element may be read out concurrently. This may be done, for example, by temporarily storing the blue component for two thirds of a period of $\phi_C$, temporarily storing the green component for one third of the period of $\phi_C$, and then, when the red color component arrives during the next third of the period of $\phi_C$, clocking out the three color components concurrently. The storage can take place externally of the C register, for example on three separate storage capacitors or, with appropriate circuit design and timing, may take place in the floating diffusions themselves. In the later mode of operation, the gate electrode 42, 42-2 and 42-3 may consist of a single structure which is controlled by a single control voltage after the simultaneous readout of the red, green and blue components.

There is also a third construction and mode of operation possible for obtaining concurrent blue, green and red color signals. It is to position the three floating diffusions in staggered fashion, that is, for example, roughly in the positions now occupied by electrodes such as 70-1, 71-2 and 72-3, respectively. This permits a common control electrode (instead of the three shown at 42, 41-2 and 42-3) to be used for reset purposes. Now, in operation, when $\phi_{C1}$ goes positive, all three color signals concurrently pass to the three floating diffusions to produce the three output signals of the C register concurrenty. Thereafter all three diffusions may be reset to the drain 44 potential by applying a control voltage to the common control electrode.

While for purposes for the present explanation, the C register has been illustrated by a particular kind of register, other forms of C registers may be used instead. As an example, the three section register and gating electrode structure illustrated in FIG. 8 of copending U.S. application Ser. No. 534,829, filed Nov. 19, 1974 by Walter F. Kosonocky for Charge Coupled Device Imager, now U.S. Pat. No. 3,971,003, and assigned to the same assignee as the present application, may be used instead. Alternatively, other forms of C register which includes a first section for receiving 1/N'th of a word at a time from the B register and N-1 other register sections, each for temporary storing 1/N'th of the word shifted to it from the first register section, with appropriate gating structures for shifting the partial rows to the C register and appropriate control circuits for reading out the C register, may be used.

In the various embodiments of the invention discussed so far, the three color components for each resolution element are read out before the three color components for the following resolution element. Thus, in the examples given by way of illustration, first the three color components for a resolution element in the group of columns 24 is read out, then the three color components for a resolution element in the columns 22 are read out, then the three color components for resolution element in the columns 20 are read out. It is also possible to operate the imager in "field-sequential" fashion. Here, the output structure may be simpler than shown and may comprise, for example, only a single section, such as $C_1$, output register. In this embodiment, first one of the color components is read out in its entirety from a row, then the next color component, and then the third color component. For example, in response to $\phi_{C1}$, the one third of a word containing the blue color component is read out from the B register into the $C_1$ register. Then that one third of a word is read out of the $C_1$ register, in its entirety, and employed, for example, for supplying the blue color signal for a row which is to be displayed on a screen of a kinescope. Thereafter, in response to $\phi_{C2}$, the second third of a word, this one containing the green color component of the signal, may be read into the $C_1$ register and then read out in its entirety, from the $C_1$ register. This second third of a word may be employed for supplying the screen color component for a row displayed on a kinescope. In similar fashion, the last third of the word, this one containing a red color component, may be transferred to the $C_1$ register and read out in its entirety from the $C_1$ register. In this form of color system, as is well understood in the art, the eye is depended upon to integrate the three different colors produced during three successive thirds of a line time.

FIG. 4 illustrates a bucket brigade embodiment of the invention. The figure shows the last three electrodes of the B register corresponding to the B register 12 of FIG. 1. The B register is shown to be one of the two phase type. The bucket brigate elements are in themselves conventional, each comprising two electrodes having a diffusion extending from beneath one electrode to beneath the leading edge portion of the next electrode ahead, that is, to the leading edge portion of the next electrode, in the direction of charge transfer. The diffused regions are illustrated as dashed square areas. The C register is shown as including three sections, section $C_1$ for storing red color signal, section $C_2$ for storing green color signal and section $C_3$ for storing blue color signal.

The operation of the embodiment of FIG. 4 is analogous to the operation of the embodiment of FIG. 1 and therefore is not discussed in detail. As in the embodiment of FIG. 1, after the transfer of a row of information into the three sections of the C register, the frequency of the $\phi_C$ multiple phase voltages must be made sufficiently high to insure that the C register is emptied before the next row of information is shifted to the last electrode 80 of the B register.

The various modifications discussed for the charge coupled device imager illustrated in FIG. 1 are equally applicable to the bucket brigade imager of FIG. 4.

What is claimed is:

1. A color charge transfer imager system comprising, in combination:

a charge transfer imaging array comprising Q columns and R rows of charge transfer elements, said columns being arranged in groups, with N adjacent columns in each group, where N is an integer greater than 1 and represents the number of different color components into which it is desired to resolve an image projected onto the array, the N columns of one row comprising the width of a resolution element of said array;

color filter means adjacent to the image receiving surface of said array, said means comprising filters of different colors adjacent the different columns, respectively, of each group, and of the same color adjacent corresponding columns of the different groups;

means for translating each row of charge signals shifted out by the array into N groups of charge signals, each group comprising 1/N'th of a row of signals, the charge signals within a group comprising the charge signals from the Q/N columns receiving a radiation image through filters for the same color, and each 1/N'th of a given row of signals representing a different one of said color components;

N temporary storage registers, each receptive of a different 1/N'th of a row of signals, each for temporarily storing the 1/N'th of a row it receives; and means for concurrently serially reading the N temporary storage registers for producing, for each resolution element of said array, N signals indictive of the N color components of that resolution element.

2. A color charge transfer imager system as set forth in claim 1 wherein said imaging array comprises a charge coupled device imaging array.

3. A color charge transfer imager system as set forth in claim 1 wherein said imaging array comprises a bucket-brigade imaging array.

4. A color charge transfer imager system as set forth in claim 1 wherein N=3 and wherein said filters comprise filters for red, blue, and green, respectively.

5. A color charge transfer imager system as set forth in claim 1, wherein said means for serially reading the N temporary storage registers includes means for producing, for each resolution element of said array, said N signals sequentially.

6. A color charge transfer imager system as set forth in claim 1, wherein said means for serially reading the N temporary storage registers includes means for producing, for each resolution element of said array, said N signals concurrently.

7. A color charge transfer imager system comprising, in combination;

a charge transfer imaging array comprising Q columns and R rows of charge transfer elements, said columns being arranged in groups, with N adjacent columns in each group, where N is an integer greater than 1 and represents the number of different color components into which it is desired to resolve an image projected onto the array, the N columns of one row comprising the width of a resolution element of said array;

color filter means adjacent to the image receiving surface of said array, said means comprising filters of different colors adjacent the different columns, respectively, of each group, and of the same color adjacent corresponding columns of the different groups;

output register means;

means for shifting each row of charge signals out of said array to said output register means, said means for shifting including means for separating each row into N parts, each part comprising the charge signals from the Q/N columns receiving a radiation image through filters for the same color, and each said part of a given row of information representing a different one of said color components; and means for serially reading out said output register means for producing, for each row read from said array, signals indicative of the N color components needed for reproducing that row.

8. A color charge transfer imager system as set forth in claim 7, wherein said output register means comprises N sections, and said means for shifting comprises means for shifting each 1/N'th of a row of charge signals into a different one of said N sections, respectively.

9. A color charge transfer imager system as set forth in claim 8, wherein said means for serially reading out said output register means comprises means for concurrently serially reading out said N sections for obtaining the N color component signals for each resolution element in a row before obtaining them for the following resolution element in that row.

* * * * *